(12) United States Patent
Song

(10) Patent No.: US 10,127,982 B2
(45) Date of Patent: *Nov. 13, 2018

(54) VOLATILE MEMORY, MEMORY MODULE INCLUDING THE SAME, AND METHOD FOR OPERATING THE MEMORY MODULE

(71) Applicant: SK hynix Inc., Gyeonggi-do (KR)

(72) Inventor: Choung-KI Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/730,388

(22) Filed: Oct. 11, 2017

(65) Prior Publication Data

US 2018/0033485 A1 Feb. 1, 2018

Related U.S. Application Data

(62) Division of application No. 15/183,395, filed on Jun. 15, 2016, now Pat. No. 9,818,482, which is a division of application No. 14/488,976, filed on Sep. 17, 2014, now abandoned.

(30) Foreign Application Priority Data

Apr. 7, 2014 (KR) .................. 10-2014-0041192

(51) Int. Cl.
*G11C 14/00* (2006.01)
*G11C 11/406* (2006.01)
*G11C 5/14* (2006.01)
*G11C 11/00* (2006.01)
*G11C 11/4072* (2006.01)

(52) U.S. Cl.
CPC .......... *G11C 14/0018* (2013.01); *G11C 5/141* (2013.01); *G11C 11/005* (2013.01); *G11C 11/4072* (2013.01); *G11C 11/40615* (2013.01); *G11C 14/0009* (2013.01)

(58) Field of Classification Search
None
See application file for complete search history.

(56) References Cited

U.S. PATENT DOCUMENTS 9,818,482 B2 * 11/2017 Song .................. G11C 14/0018
2003/0076726 A1 * 4/2003 Cowles ................. G11C 11/406
365/222

\* cited by examiner

*Primary Examiner* — James G Norman
(74) *Attorney, Agent, or Firm* — IP & T Group LLP

(57) ABSTRACT

A memory module includes an emergency power supplier, a plurality of ranks each including one or more volatile memories, a non-volatile memory, and a controller suitable for backing up data of the ranks into the non-volatile memory by using the emergency power supplier during a power failure, wherein the ranks are sequentially backed up, and while one rank is backed up among the ranks, the other ranks are controlled in a self-refresh mode.

3 Claims, 6 Drawing Sheets

VOLATILE MEMORY, MEMORY MODULE INCLUDING THE SAME, AND METHOD FOR OPERATING THE MEMORY MODULE

CROSS-REFERENCE TO RELATED APPLICATIONS

This application is a division of U.S. patent application Ser. No. 15/183,395 filed on Jun. 15, 2016, titled "VOLATILE MEMORY, MEMORY MODULE INCLUDING THE SAME, AND METHOD FOR OPERATING THE MEMORY MODULE", which is a division of U.S. patent application Ser. No. 14/488,976 filed on Sep. 17, 2014, and now abandoned, which claims priority of Korean Patent Application No. 10-2014-0041192, filed on Apr. 7, 2014. The disclosure of each of the foregoing application is incorporated herein by reference in its entirety.

BACKGROUND

1. Field

Exemplary embodiments of the present invention relate to a memory, and a memory module including the memory.

2. Description of the Related Art

Data processing systems, such as personal computers (PC), workstations, server computers, and communication systems generally include a memory module where a plurality of memories, or chips, are mounted as a data storage memory on a module board.

Memory modules that are used in the data processing systems include volatile memories, such as Dynamic Random Access Memory (DRAM). Volatile memories may operate at a high data rate, but when power supply is cut off, the volatile memories lose the data stored therein. Therefore, a Non-Volatile Dial In Line Memory Module (NVDIMM) has been introduced. The NVDIMM adopts an emergency power supply and a non-volatile memory along with a volatile memory. When host power is instable, the NVDIMM backs up the data of the volatile memory into the non-volatile memory with the use of the emergency power. The NVDIMM may protect data from being lost due to a failure in the host power.

A capacitor is generally used as the emergency power supply for the NVDIMM. In order to generate high power, the capacitor may have high capacitance, and this leads to an increase in the production cost thereof. Therefore, it would be beneficial to develop a technology for safely backing up the data of a volatile memory into a non-volatile memory with low power consumption.

SUMMARY

An embodiment of the present invention is directed to a technology for safely backing up the data of a volatile memory into a non-volatile memory with minimal power consumption.

In accordance with an embodiment of the present invention, a memory module includes an emergency power supplier, a plurality of ranks each including one or more volatile memories, a non-volatile memory, and a controller suitable for backing up data of the ranks into the non-volatile memory by using the emergency power supplier during a power failure, wherein the ranks are sequentially backed up, and while one rank is backed up among the ranks, the other ranks are controlled in a self-refresh mode.

Two or more ranks among the ranks may share a dock enable signal, and the two or more ranks sharing the clock enable signal are controlled to enter a self-refresh mode individually.

In accordance with another embodiment of the present invention, a memory module includes an emergency power supplier, a plurality of ranks each including one or more volatile memories, a non-volatile memory, and a controller suitable for backing up data of the ranks into the non-volatile memory by using the emergency power supplier during a power failure, wherein the ranks are sequentially backed up and controlled to enter a maximal power-saving mode.

The ranks may consume less power in the maximal power-saving mode than a self refresh mode. The ranks may be cut off from the emergency power supplier in the maximal power-saving mode. The ranks may be controlled in a self-refresh mode before the ranks are backed up.

In accordance with another embodiment of the present invention, a volatile memory includes a clock enable reception unit suitable for receiving a clock enable signal, a mode setup unit suitable for setting up a self-refresh prevention mode for preventing, the volatile memory from entering a self-refresh mode, a self-refresh control unit suitable for setting a self-refresh mode signal in response to the clock enable signal and an internal refresh command, while maintaining the self-refresh mode signal in a disabled state in the self refresh prevention mode.

The volatile memory may further include a command reception unit suitable for receiving a command, an address reception unit suitable for receiving an address and a command decoding unit suitable for generating an internal mode register set command and the internal refresh command by decoding the command, wherein the mode setup unit sets up the self-refresh prevention mode based on the internal mode register set command and the address.

In accordance with another embodiment of the present invention, a volatile memory includes a clock enable reception unit suitable for receiving a clock enable signal, a command reception unit suitable for receiving a command, an address reception unit suitable for receiving an address, a command decoding unit suitable for generating an internal mode register set command and an internal refresh command by decoding the command, a mode setup unit suitable for generating an entry signal based on the internal mode register set command and the address, and a self-refresh control unit suitable for generating a self-refresh mode signal in response to the dock enable signal and the internal refresh command, while enabling the self-refresh mode signal when the entry signal is enabled.

In accordance with another embodiment of the present invention, a method for operating a memory module including a non-volatile memory and a plurality of ranks each including one or more volatile memories includes detecting a power failure of a host, switching a power source of the memory module from a host power to an emergency power, sequentially backing up data of the ranks into the non-volatile memory, and controlling ranks other than a rank of which data is being backed up in the sequentially backing up, among the ranks, in a self-refresh mode.

The method may further include restoring the data backed up in the non-volatile memory back into the ranks, when the host power is recovered.

In accordance with another embodiment of the present invention, a method for operating a memory module including a non-volatile memory and a plurality of ranks each including one or more volatile memories includes detecting a power failure of a host, switching a power source of the memory module from a host power to an emergency power, sequentially backing up data of the ranks into the non-volatile memory and controlling the ranks to enter a maximal power-saving mode after the backing up of data of the respective ranks.

The ranks may consume less power in the maximal power-saving mode than in a self refresh mode. The controlling of the ranks to enter the maximal power-saving mode may include cutting off the ranks from the emergency power. The method may further include controlling the ranks in a self-refresh mode, before the backing up of the data of the ranks.

DETAILED DESCRIPTION

Figure 1:
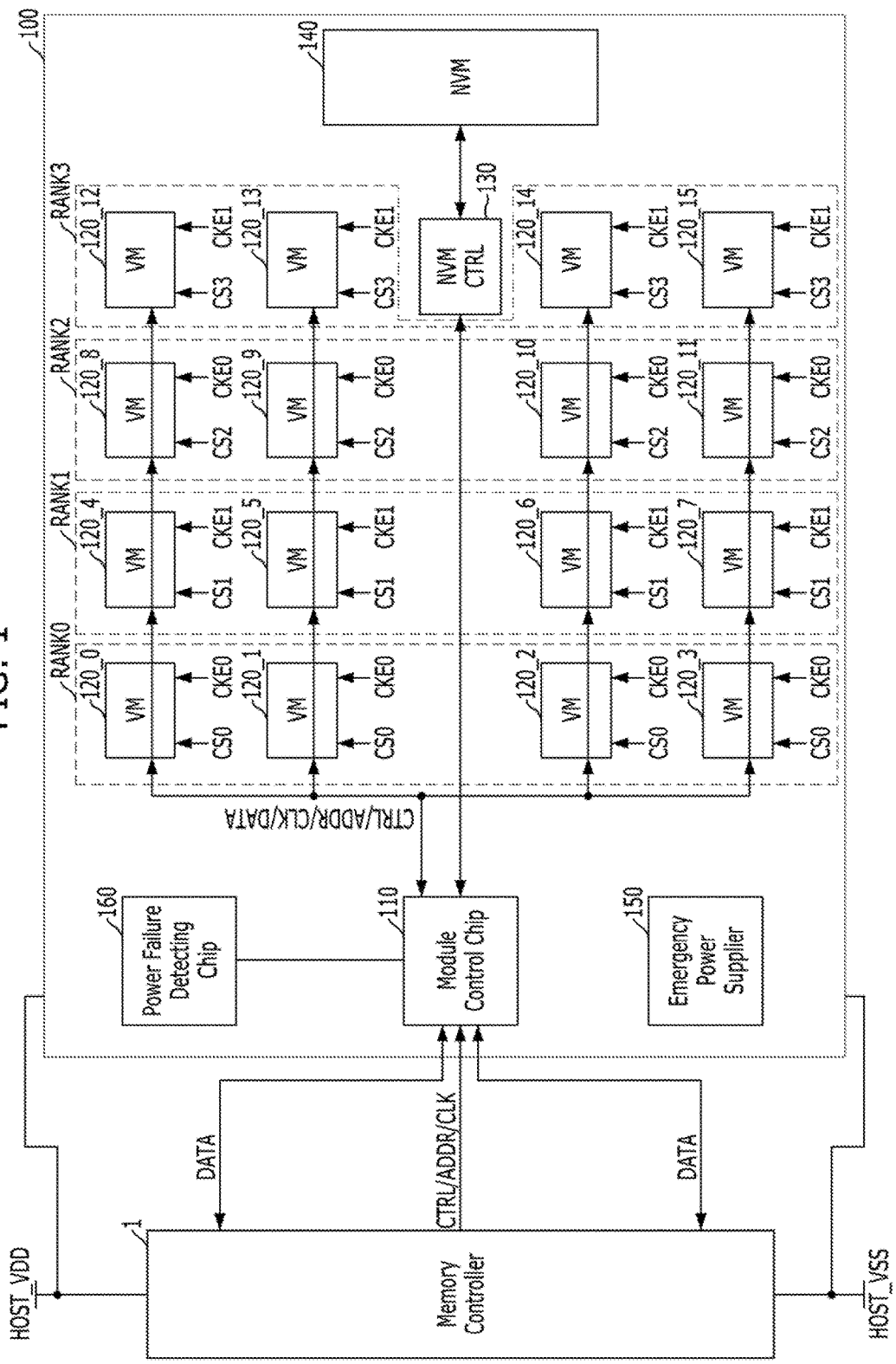
FIG. 1 is a block view illustrating a memory module 100 in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating a memory module 100 in accordance with an embodiment of the present invention.

Referring to FIG. 1, the memory module 100 may protect data from being lost by backing up the data stored in volatile memory chips 120_0 to 120_15 in a non-volatile memory chip 140, when the power of a host is instable. For the simple description, a memory controller 1 of a host is illustrated as well. The memory controller 1 provides control signals CTRL, addresses ADDR, and clocks CLK for controlling the memory module 100 while transmitting/receiving data to/from the memory module 100.

Referring to FIG. 1, the memory module 100 may include a module control chip 110, the volatile memory chips (VMS) 120_0 to 120_15, a non-volatile memory control chip (NVM CTRL) 130, the non-volatile memory chip (NVM) 140, an emergency power supplier 150, and a power failure detecting chip 160. The volatile memory chips 120_0 to 120_15 may be Dynamic Random Access Memories (DRAMs), and the non-volatile memory chip 140 may be a flash memory.

However the volatile memory chips 120_0 to 120_15 may be volatile memories other than DRAMs, and the non-volatile memory chip 140 may be a non-volatile memory other than a flash memory as well.

When the power HOST_VDD and HOST_VSS of the host in a normal/stable state, the module control chip 110 may buffer and supply control signals CTRL, which are commands and signals for controlling the volatile memory chips 120_0 to 120_15, addresses ADDR and clocks CLK, from the memory controller 1 to the volatile memory chips 120_0 to 120_15. Also, the module control chip 110 may buffer and transmit data DATA between the memory controller 1 and the volatile memory chips 120_0 to 120_15. In short, when the power of the host is in a stable condition, the module control chip 110 may perform a function of relaying the communication between the volatile memory chips 120_0 to 120_15 and the memory controller 1.

When a failure is detected in the power HOST_VDD and HOST_VSS of the host, in other words, when a power supply voltage HOST_VDD and/or a ground voltage HOST_VSS of the host is detected to be instable, the power failure detecting chip 160 may cut off the supply of the host power HOST_VDD and HOST_VSS to the memory module 100 and control the memory module 100 to operate using the power of the emergency power supplier 150. The emergency power supplier 150 may be formed of one or more capacitors, for example, super capacitors having large-scale capacitance, and the emergency power supplier 150 may supply emergency power to the memory module 100 while the data of the volatile memory chips 120_0 to 120_15 is backed up into the non-volatile memory chip 140. Meanwhile, the power failure detecting chip 160 may notify the module control chip 110 of the failure in the host power HOST_VD and HOST_VSS, after detecting the power failure.

Notified of the failure in the host, power HOST_VDD and HOST_VSS, the module control chip 110 may perform a control to back up the data stored in the volatile memory chips 120_0 to 120_15 into the non-volatile memory chip 140. To be specific, the module control chip 110 may control the non-volatile memory control chip 130 to read the data stored in the volatile memory chips 120_0 to 120_15 and to program (or write) the data read out of the volatile memory chips 120_0 to 120_15 into the non-volatile memory chip 140 by applying a control signal CTRL and an address ADD that are generated in the module control chip 110 to the non-volatile memory control chip 130 and the volatile memory chips 120_0 to 120_15. The non-volatile memory control chip 130 may control the non-volatile memory chip 140 to program the data DATA transmitted from the module control chip 110, which is the data read out of the volatile memory chips 120_0 to 120_15 into the non-volatile memory chip 140.

When the host power HOST_VDD and HOST_VSS comes back into the stable state, the data which is backed up in the non-volatile memory chip 140 in a power failure, may be transmitted back to the volatile memory chips 120_0 to 120_15 and restored.

The volatile memory chips 120_0 to 120_15 may be divided into a plurality of ranks RANK0 to RANK3. Herein, a rank may mean a set of chips that share one chip selection signal CS. The chips of a rank may have different pins for receiving the data DATA but they may share the same chip selection signal CS, the same control signal CTRL, and the same address ADDR. Therefore, the volatile memory chips of the same rank may be logically regarded as one memory chip and operate simultaneously. For example, the ranks RANK0 to RANK3 may correspond to different chip selection signals CS0 to CS3, respectively.

Different clock enable signals CKE may be assigned and used for the ranks RANK0 to RANK3, but in most cases, a clock enable signal CKE is assigned to two or more ranks. The clock enable signals CKE are signals for controlling a self-refresh operation and they are used to represent a section where a memory has to operate in synchronization with a clock CLK. The drawing shows a case where a clock enable signal CKE0 is assigned to ranks RANK0 and RANK2, and a clock enable signal CKE1 is assigned to ranks RANK1 and RANK3. The ranks sharing a clock enable signal generally enter a self-refresh mode simultaneously. A technology for individually entering a self-refresh mode while sharing the same clock enable signal will be described below with reference to FIGS. 2 and 3.

Although the chip selection signals CS0 to CS3 and the clock enable signals CKE0 and CKE1 belong to the control signals CTRL, they are illustrated as the separate signals CS0 to CS3, CKE0 and CKE1 that are assigned to the ranks RANK0 to RANK3. Also, the structures shown in FIG. 1 are not in physical distinction, but in functional distinction from each other. For example, each of the structures shown in FIG. 1 may represent one semiconductor chip, but more than two of the structures shown in FIG. 1 may be formed in one physical semiconductor chip.

Figure 2:
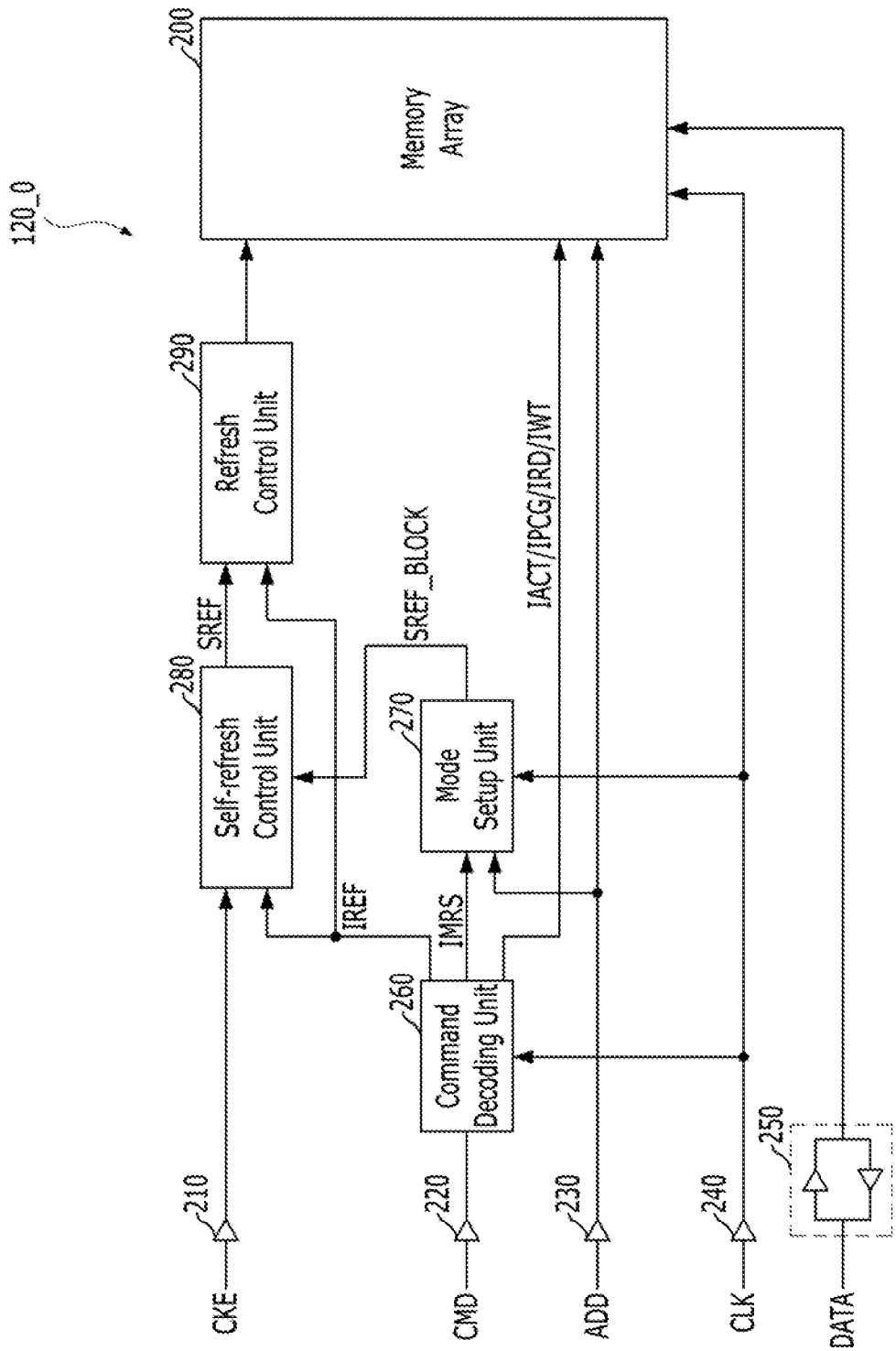
FIG. 2 is a block view illustrating a volatile memory chip 120_0 in accordance with an embodiment of the present invention.

FIG. 2 is a block view illustrating a volatile memory chip 120_0 in accordance with an embodiment of the present invention. The other volatile memory chips 120_1 to 120_15 may be formed the same as that of FIG. 2.

Referring to FIG. 2, the volatile memory chip 120_0 may include a clock enable signal reception unit 210, a command reception unit 220, an address reception unit 230, a clock reception unit 240, a data transmission/reception unit 250, a command decoding unit 260, a mode setup unit 270, a self-refresh control unit 280, a refresh control unit 290, and a memory array 200.

The clock enable signal reception unit 210 may receive the dock enable signal CKE0. Since the volatile memory chip 120_0 belongs to a rank RANK0, the clock enable signal reception unit 210 may receive the clock enable signal CKE0 between the clock enable signals CKE0 and CKE1.

The command reception unit 220 may receive a command CMD that is formed of multi-bit signals. The command CMD may include a row address strobe signal (RAS), a column address strobe signal (CAS), an active signal ACT, and a chip selection signal CS0. Since the volatile memory chip 120_0 belongs to the rank RANK0, the command reception unit 220 may receive the chip selection signal CS0 among the chip selection signals CS0 to CS3.

The address reception unit 230 may receive an address ADDR that is formed of multi-bit signals. The clock reception unit 240 may receive a clock CLK. The clock CLK received by the clock reception unit 240 may be differential clocks including a clock and a clock bar that is obtained by inverting the clock. The clock CLK received by the clock reception unit 240 may be used for synchronized operation of the volatile memory chip 120_0. The data transmission/reception unit 250 may receive a write data DATA inputted from the exterior and transmit received data to the memory array 200, or receive a data outputted from the memory array 200 and transmit received data to the exterior as a read data DATA.

The command decoding unit 260 may generate diverse internal commands IACT, IPCG, IRD, IWT, IREF and IMRS by decoding the command CMD received through the command reception unit 220. The internal commands generated by the command decoding unit 260 may include an internal active command IACT for commanding an active operation, an internal pre-charge command IPCG for commanding a pre-charge operation, an internal read command IRD for commanding a read operation, an internal write command IWT for commanding a write operation, an internal refresh command IREF for commanding a refresh operation, and an internal mode register set command IMRS for commanding a setup operation.

The mode setup unit 270 may perform diverse setup operations by decoding the address ADDR that is received through the address reception unit 230 when the internal mode register set command IMRS is enabled. The setup operations performed by the mode setup unit 270 may include setting up diverse internal voltage levels, setting up diverse delay values, and setting up diverse modes. The modes set up by the mode setup unit 270 may include a self-refresh prevention mode. In the self-refresh prevention mode, a self-refresh prevention signal SREF_BLOCK may be enabled.

The self-refresh control unit 280 may control the entry/exit to/from a self-refresh mode. The self-refresh control unit 280 may enable a self-refresh mode signal SREF when the internal refresh command IREF is enabled in a section where the clock enable signal CKE0 is disabled from a logic high level to a logic low level. When the clock enable signal CKE0 is enabled from a logic low level to a logic high level, it may disable the self-refresh mode signal SREF. The enabling of the self-refresh mode signal SREF may represent that the current mode is a self-refresh mode, and the disabling of the self-refresh mode signal SREF may represent that the current mode is not a self-refresh mode. Meanwhile, when the self-refresh prevention signal SREF_BLOCK is enabled, the self-refresh control unit 280 does not enable the self-refresh mode signal SREF regardless of the value of the internal refresh command IREF and the value of the clock enable signal CKE0. By setting up self-refresh prevention mode, it is possible to disregard a self-refresh command that is transmitted from the exterior. In this way, it is, possible to control different ranks (e.g. the ranks RANK0 and RANK2) sharing the same clock enable signal CKE0 to enter the self-refresh mode or exit from the self-refresh mode individually.

The refresh control unit 290 may control a plurality of rows inside the memory array 200 to be sequentially refreshed at a predetermined period during a section where the self-refresh mode signal SREF is enabled. Meanwhile, the refresh control unit 290 controls one row among a plurality of rows inside the memory array 200 to be refreshed when the internal refresh command IREF is enabled. Whenever the internal refresh command IREF is enabled, the row refreshed inside of the memory array 200 may be changed continuously. This refresh operation is referred to as an auto-refresh operation, which is different from a self-refresh operation.

The memory array 200 may include a cell array including a plurality of memory cells that are arranged in a plurality of rows and a plurality of columns, a row circuit for controlling a row operation (e.g., an active operation, a pre-charge operation, and a refresh operation) of the cell array, and a column circuit for controlling a column operation (e.g., an read operation and a write operation) of the cell array. Operations designated by the internal commands IACT, IPCG, IRS, and IWT may be performed in memory cells designated by the address ADDR among the memory cells of the memory array 200.

Figure 3:
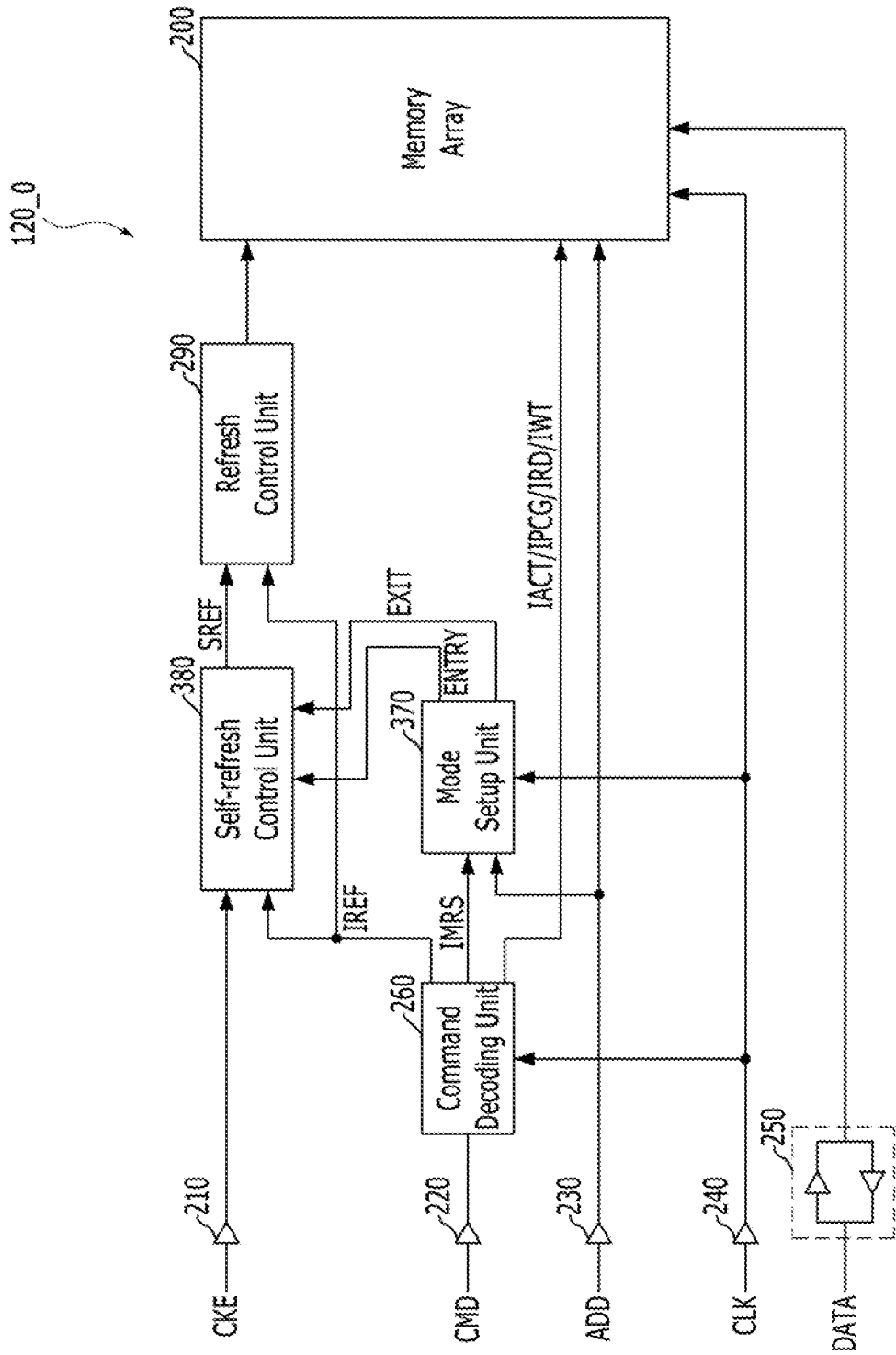
FIG. 3 is a block view illustrating a volatile memory chip 120_0 in accordance with another embodiment of the present invention.

FIG. 3 is a block view illustrating a volatile memory chip 120_0 in accordance with another embodiment of the present invention. The other volatile memory chips 120_1 to 120_15 may be formed the same as the volatile memory chip 120_0 shown in FIG. 3.

Referring to FIG. 3, the volatile memory chip 120_0 may include a clock enable signal reception unit 210, a command reception unit 220, an address reception unit 230, a clock reception unit 240, a data transmission/reception unit 250, a command decoding unit 260, a refresh control unit 290, and a memory array 200. The volatile memory chip 120_0 of this embodiment shown in FIG. 3 may include a mode setup unit 370 and a self-refresh control unit 380, which operate differently from those shown in FIG. 2. Hereafter, the mode setup unit 370 and the self-refresh control unit 380 are described.

The mode setup unit 370 may perform diverse setup operations by decoding an address ADDR that is received through the address reception unit 230 when the internal mode register set command IMRS is enabled. The setup operations performed by the mode setup unit 370 may include setting up diverse internal voltage levels, setting up diverse delay values, and setting up diverse modes. The mode setup unit 370 may also generate an entry signal ENTRY and an exit signal EXIT. The entry signal ENTRY may be enabled when the address ADDR has a particular combination while the internal mode register set command IMRS is enabled. Likewise, the exit signal EXIT may be enabled when the address ADDR has a particular combination that is different from that of the entry signal ENTRY while the internal mode register set command IMRS is enabled.

The self-refresh control unit 380 may control the entry/exit to/from a self-refresh mode. The self-refresh control unit 380 may enable a self-refresh mode signal SREF when an internal refresh command IREF is enabled in a section where the clock enable signal CKE0 is disabled from a logic high level to a logic low level. When the clock enable signal CKE0 is enabled from a logic low level to a logic high level, it may disable the self-refresh mode signal SREF. The enabling of the self-refresh mode signal SREF may represent that the current mode is a self-refresh mode, and the disabling of the self-refresh mode signal SREF may represent that the current mode is not a self-refresh mode. Meanwhile the self-refresh control unit 380 may enable the self-refresh mode signal SREF when the entry signal ENTRY is enabled, and it may disable the self-refresh mode signal SREF when the exit signal EXIT is enabled. In the embodiment of FIG. 3, the entry signal ENTRY and the exit signal EXIT are generated through a combination of a command CMD and an address ADDR without using a clock enable signal CKE0, and the entry/exit to/from the self-refresh mode may be carried out based on the entry signal ENTRY and the exit signal EXIT. In this way, it is possible to control different ranks (e.g., the rank RANK0 and RANK2) sharing the same clock enable signal CKE0 to enter the self-refresh mode or exit from the self-refresh mode individually.

Figure 4:
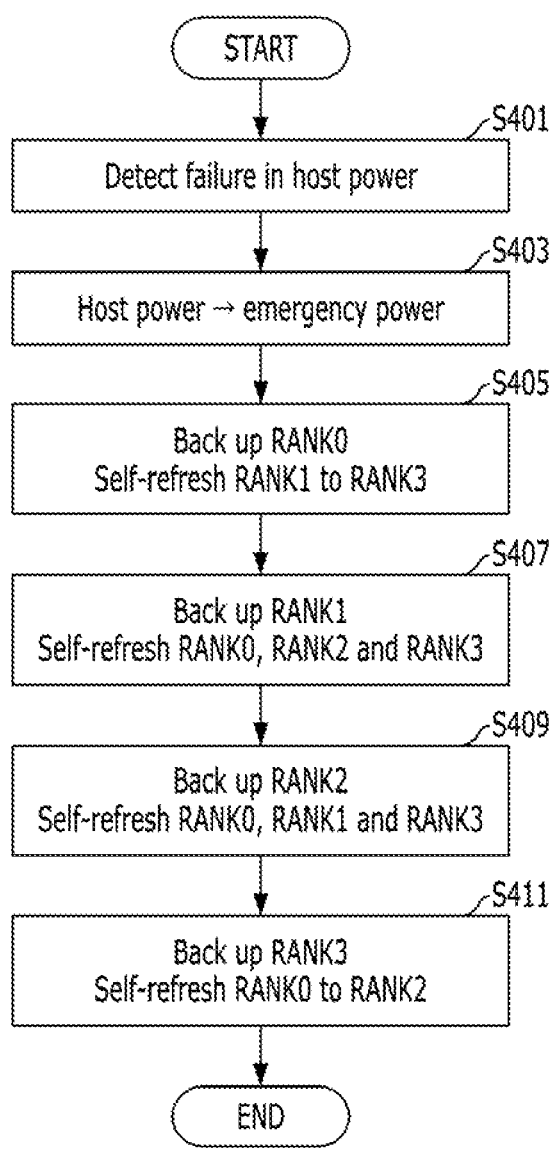
FIG. 4 illustrates a method for operating the memory module 100 in accordance with an embodiment of the present invention.

FIG. 4 illustrates a method for operating the memory module 100 in accordance with an embodiment of the present invention. Described hereafter is a process of backing up the data of the volatile memory chips 120_0 to 120_15 into the non-volatile memory 140 when a failure occurs in the power of the host.

Referring to FIG. 4, in step S401, a failure may occur in the power HOST_VDD and HOST_VSS of the host. The failure in the power HOST_VDD and HOST_VSS of the host may mean that the power HOST_VDD and HOST_VSS of the host becomes so instable that the memory module 100 may not operate stably.

After detecting a failure in the host power HOST_VDD and HOST_VSS, the memory module 100 may switch its power source from the instable host power HOST_VDD and HOST_VSS to an emergency power supplied by the emergency power supplier 150 in step S403.

A back-up operation then begins, and the data of the volatile memory chips 120_0 to 120_3 that belong to the rank RANK0 may be backed up into the non-volatile memory 140 in step S405. This may mean that a read operation is performed in the volatile memory chips 120_0 to 120_3 and a program operation for programming (writing) the data read out of the volatile memory chips 120_0 to 120_3 is performed in the non-volatile memory 140. While the data of the rank RANK0 are backed up, the other ranks RANK1, RANK2 and RANK3 may be controlled in the self-refresh mode. Although the rank RANK2 shares the same clock enable signal CKE0 as that of the rank RANK0, the rank 2 RANK2 may be controlled to enter the self-refresh mode alone while the rank 0 RANK0 does not enter the self-refresh mode through the method described with reference to FIG. 2 or 3.

After the back-up operation of the rank RANK0 is completed, the data of the volatile memory chips 120_4 to 124_7 that belong to the rank RANK1 may be backed up into the non-volatile memory chip 140 in step S407. While the rank RANK1 is backed up, the other ranks RANK0, RANK2 and RANK3 may be controlled in the self-refresh mode.

Meanwhile, the rank RANK2 and the rank RANK3 may be backed up in steps S409 and S411 in the same manner as the rank RANK0 and the rank RANK1 are backed up, and all back-up operations may be completed in this way.

The data backed up in the non-volatile memory 140 though the above-described method may be transmitted back to the volatile memory chips 120_0 to 120_15 and stored therein after the host power HOST_VDD and HOST_VSS is recovered.

According to the back-up method of FIG. 4 the other ranks except the rank which is being backed up are all controlled in the self-refresh mode. Since the volatile memory chips 120_0 to 120_15 consume a minimal amount of power for preventing data loss in the self-refresh mode, the back-up method of FIG. 4 may prevent the data from being lost while minimizing the power consumption used for the back-up operation.

Figure 5:
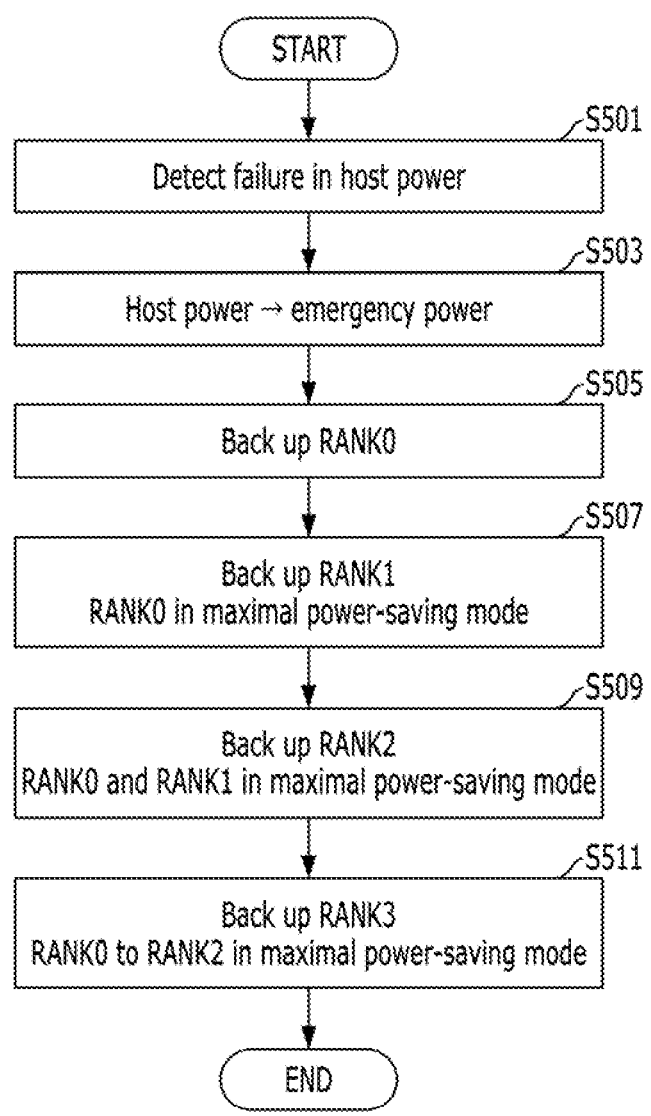
FIG. 5 illustrates a method for operating the memory module 100 in accordance with another embodiment of the present invention.

FIG. 5 illustrates a method for operating the memory module 100 in accordance with another embodiment of the present invention. Described hereafter is a process of backing up the data of the volatile memory chips 120_0 to 120_15 into the non-volatile memory 140 when a failure occurs in the power of the host.

Referring to FIG. 5, in step S501, a failure may occur in the power HOST_VDD and HOST_VSS of the host. The failure in the power HOST_VDD and HOST_VSS of the host may mean that the power HOST_VDD and HOST_VSS of the host becomes so instable that the memory module 100 may not operate stably.

After detecting a failure in the host power HOST_VDD and HOST_VSS the memory module 100 may switch its power source from the instable host power HOST_VDD and HOST_VSS to an emergency power supplied by the emergency power supplier 150 in step S503.

A back-up operation then begins, and the data of the volatile memory chips 120_0 to 120_3 that belong to the rank RANK0 may be backed up into the non-volatile memory 140 in step S505. This may mean that a read operation is performed in the volatile memory chips 120_0 to 120_3, and a program operation for programming (writing) the data read out of the volatile memory chips 120_0 to 120_3 is performed in the non-volatile memory 140. While the data of the rank RANK0 are backed up, the other ranks RANK1, RANK2 and RANK3 on which the back-up operation are not performed may be controlled to perform an auto-refresh operation at a predetermined period in order not to lose the data.

After the back-up operation of the rank RANK0 is completed, the data of the volatile memory chips 120_4 to 120_7 that belong to the rank RANK1 may be backed up into the non-volatile memory 140 in step S507. The rank RANK0 whose back-up operation is completed may be controlled in a maximal power-saving mode. In the maximal power-saving mode, the power supply to the rank RANK0 may be cut off under the control of the module control chip 110, or the rank RANK0 may consume less power than it does in the self-refresh mode, in other words, it retains the data. Since the data of the rank RANK0, is already backed up, it does not matter whether the data of the rank RANK0 is lost. Thus, the rank RANK0 may be controlled in the manner described above. The other ranks RANK2 and RANK3 may be controlled to perform an auto-refresh operation at a predetermined period in order not to lose the data.

After the back-up operation of the rank RANK1 is completed, the data of the volatile memory chips 120_8 to 120_11 that belong to the rank RANK2 may be backed up into the non-volatile memory 140 in step S509. The ranks RANK0 and RANK1, whose back-up operations are completed, may be controlled in the maximal power-saving mode, and the power supply to the ranks RANK0 and RANK1 may be cut off. The other rank RANK3 may be controlled to perform an auto-refresh operation at a predetermined period in order not to lose the data.

After the back-up operation of the rank RANK2 is completed, the data of the volatile memory chips 120_12 to 120_15 that belong to the rank RANK3 may be backed up into the non-volatile memory 140 in step S511. The ranks 0RANK0, RANK1 and RANK2 whose back-up operations are completed may be controlled in the maximal power-saving mode, and the power supply to the ranks RANK0, RANK1 and RANK2 may be cut off.

The data backed up into the non-volatile memory 140 though the above-described method may be transmitted back to the volatile memory chips 120_0 to 120_15 and stored therein after the host power HOST_VDD and HOST_VSS is recovered.

According to the back-up method of FIG. 5, the ranks whose back-up operations are completed, which are the ranks that do not need to retain their data, are all controlled n the maximal power-saving mode. Since the ranks whose back-up operations are completed do not consume the power at all or consume less power than they do when they are in a self-refresh mode, the amount of power that the memory module 100 consumes to back up the data may be reduced.

Figure 6:
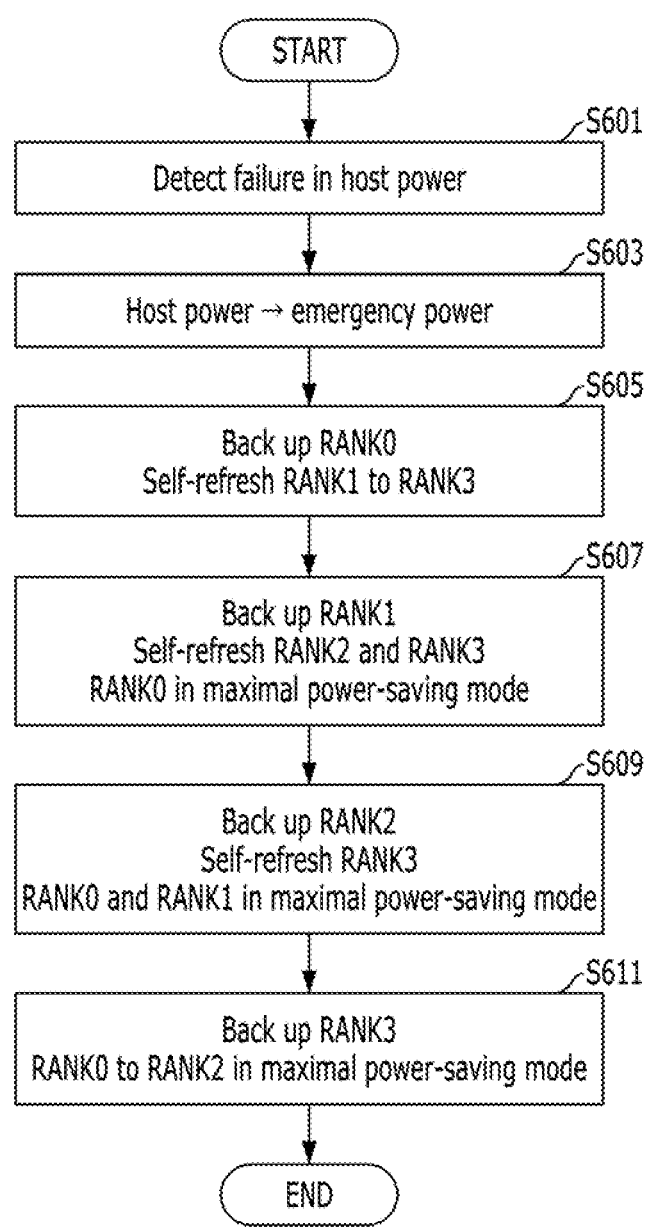
FIG. 6 illustrates a method for operating the memory module 100 in accordance with yet another embodiment of the present invention.

FIG. 6 illustrates a method for operating the memory module 100 in accordance with yet another embodiment of the present invention. Described hereafter is a back-up method that includes the features of the back-up method of FIG. 4 and the back-up method of FIG. 5.

Referring to FIG. 6, in step S601, a failure may occur in the power HOST_VDD and HOST_VSS of the host. The failure in the power HOST_VDD and HOST_VSS of the host may mean that the power HOST_VDD and HOST_VSS of the host becomes so instable that the memory module 100 may not operate stably.

After detecting a failure in the host power HOST_VDD and HOST_VSS, the memory module 100 may switch its power source from the instable host power HOST_VDD and HOST_VSS to an emergency power supplied by the emergency power supplier 150 in step S603.

A back-up operation then begins, and the data of the volatile memory chips 120_0 to 120_3 that belong to the rank RANK0 may be backed up into the non-volatile memory 140 in step S605. This may mean that a read operation is performed in the volatile memory chips 120_0 to 120_3 and a program operation for programming (writing) the data read out of the volatile memory chips 120_0 to 120_3 is performed in the non-volatile memory 140. While the data of the rank RANK0 is backed up, the other ranks RANK1, RANK2 and RANK3 on which the back-up operation is not performed may be controlled in the self-refresh mode.

After the back-up operation of the rank RANK0 is completed, the data of the volatile memory chips 120_4 to 120_7 that belong to the rank RANK1 may be backed up into the non-volatile memory chip 140 in step S607. The rank RANK0 whose back-up operation is completed may be controlled in the maximal power-saving mode, and the other ranks RANK2 and RANK3 whose back-up operations are not completed yet may be controlled in the self-refresh mode.

While the rank RANK2 is backed up in step S609, the ranks RANK0 and RANK1 whose back-up operations are completed may be controlled in the maximal power-saving mode, and the other rank RANK3 whose back-up operation is not completed yet may be controlled in the self-refresh mode. Likewise, while the rank RANK3 is backed up in step S611, the ranks RANK0, RANK1 and RANK2 whose back-up operations are completed may be controlled in the maximal power-saving mode.

According to the back-up method of FIG. 6, when a certain rank is backed up, ranks whose back-up operations are completed among the other ranks may be controlled in the maximal power-saving mode, and ranks whose back-up operations are not completed yet may be controlled in the self-refresh mode. Therefore the ranks whose back-up operations are completed may be controlled not to consume the power at all, and the ranks whose back-up operations are not completed yet may be controlled to consume a minimal amount of power required for preventing data loss. In this way, the amount of power that the memory module 100 consumes to back up the data may be minimized. Reducing the amount of power that the memory module 100 consumes to back up the data may mean that the capacity of the emergency power supplier 150 mounted on the memory module 100 may be decreased, which leads to reduced production cost of the memory module 100.

According to an embodiment of the present invention, a memory module may back up the data of a volatile memory into a non-volatile memory with minimal power consumption.

While the present invention has been described with respect to the specific embodiments, it will be apparent to those skilled in the art that various changes and modifications may be made without departing from the spirit and scope of the invention as defined in the following claims.

What is claimed is:

1. A volatile memory, comprising:
   a clock enables reception unit suitable for receiving a clock enable signal;

a mode setup unit suitable for setting up a self-refresh prevention mode for preventing the volatile memory from entering a self-refresh mode; and a self-refresh control unit suitable for generating a self-refresh mode signal in response to the clock enable signal and an internal refresh command, while maintaining the self-refresh mode signal in a disabled state in the self-refresh prevention mode when entering the self-refresh mode is indicated by the clock enable signal and the internal refresh command.

2. The volatile memory of claim 1, further comprising:

a command reception unit suitable for receiving a command;

an address reception unit suitable for receiving an address; and a command decoding unit suitable for generating an internal mode register set command and the internal refresh command by decoding the command, wherein the mode setup unit sets up the self-refresh prevention mode based on the internal mode register set command and the address.

3. The volatile memory of claim 1, wherein the entering of the self-refresh mode is indicated when the clock enable signal is disabled from a logic high level to a logic low level and the self-refresh mode signal is enabled.

* * * * *